(12) United States Patent
Hsu (10) Patent No.: US 8,546,822 B2
(45) Date of Patent: Oct. 1, 2013

(54) BACKLIGHT FILM, METHOD AND APPARATUS FOR FORMING SAME

(75) Inventor: Chia-Ling Hsu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 200 days.

(21) Appl. No.: 13/094,757

(22) Filed: Apr. 26, 2011

(65) Prior Publication Data

US 2012/0138964 A1    Jun. 7, 2012

(30) Foreign Application Priority Data

Dec. 6, 2010    (TW) .............................. 99142267 A (51) Int. Cl.
*H01L 33/00* (2010.01)

(52) U.S. Cl.
USPC ..................................... 257/88; 257/E33.065

(58) Field of Classification Search
USPC ........................................................... 257/88
See application file for complete search history.

(56) References Cited

U.S. PATENT DOCUMENTS

| | | | |
|---|---|---|---|
| 7,061,176 B2* | 6/2006 | Kobayashi | 313/506 |
| 7,498,186 B2* | 3/2009 | Lee | 438/28 |
| 7,858,435 B2* | 12/2010 | Lee et al. | 438/99 |
| 7,952,107 B2* | 5/2011 | Daniels et al. | 257/80 |
| 2001/0001050 A1* | 5/2001 | Miyashita et al. | 428/690 |
| 2002/0033664 A1* | 3/2002 | Kobayashi | 313/504 |
| 2005/0121670 A1* | 6/2005 | Lee et al. | 257/40 |
| 2005/0170551 A1* | 8/2005 | Strip | 438/88 |
| 2010/0176385 A1* | 7/2010 | Lifka et al. | 257/40 |
| 2011/0018006 A1* | 1/2011 | Huh et al. | 257/88 |

\* cited by examiner

*Primary Examiner* — Benjamin Sandvik
(74) *Attorney, Agent, or Firm* — Altis & Wispro Law Group, Inc.

(57) ABSTRACT

A backlight film includes a flexible substrate with a first electrode layer, a polymeric light emitting layer, a second electrode layer and a protection layer formed subsequently on the flexible substrate. The first electrode layer, the polymeric light emitting layer and the second electrode layer each has a predetermined pattern. The backlight film further includes an insulating layer arranged around the polymeric light emitting layer. A method and an apparatus for forming the backlight film are also provided.

11 Claims, 8 Drawing Sheets

FIG. 8

BACKLIGHT FILM, METHOD AND APPARATUS FOR FORMING SAME

BACKGROUND

1. Technical Field

The present disclosure relates to a backlight film with polymer light emitting diode array, also a method and an apparatus for forming the backlight film.

2. Description of Related Art

Light emitting diodes (LEDs) have been widely used in backlight modules. These LEDs are usually preformed and arranged on a side of a light guide plate. However, in this way, if the light guide plate becomes thinner, the mounting the LEDs becomes difficult, and the brightness of the backlight module is lowered.

What is needed, therefore, is a backlight film that can reduce the thickness of the light guide plate while maintaining the brightness of the backlight module.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Embodiments of the present disclosure will now be described in detail below and with reference to the drawings.

Figure 1:
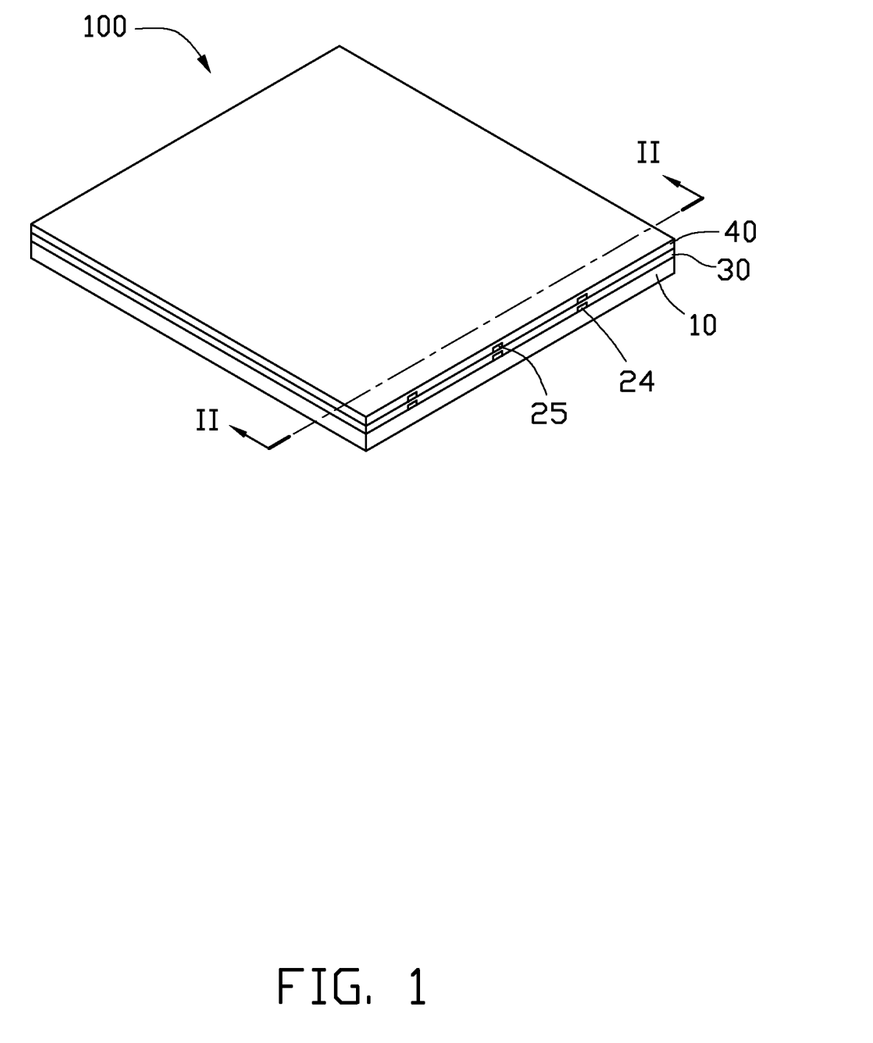
FIG. 1 is an isometric view of a backlight film in accordance with one embodiment.
Figure 2:
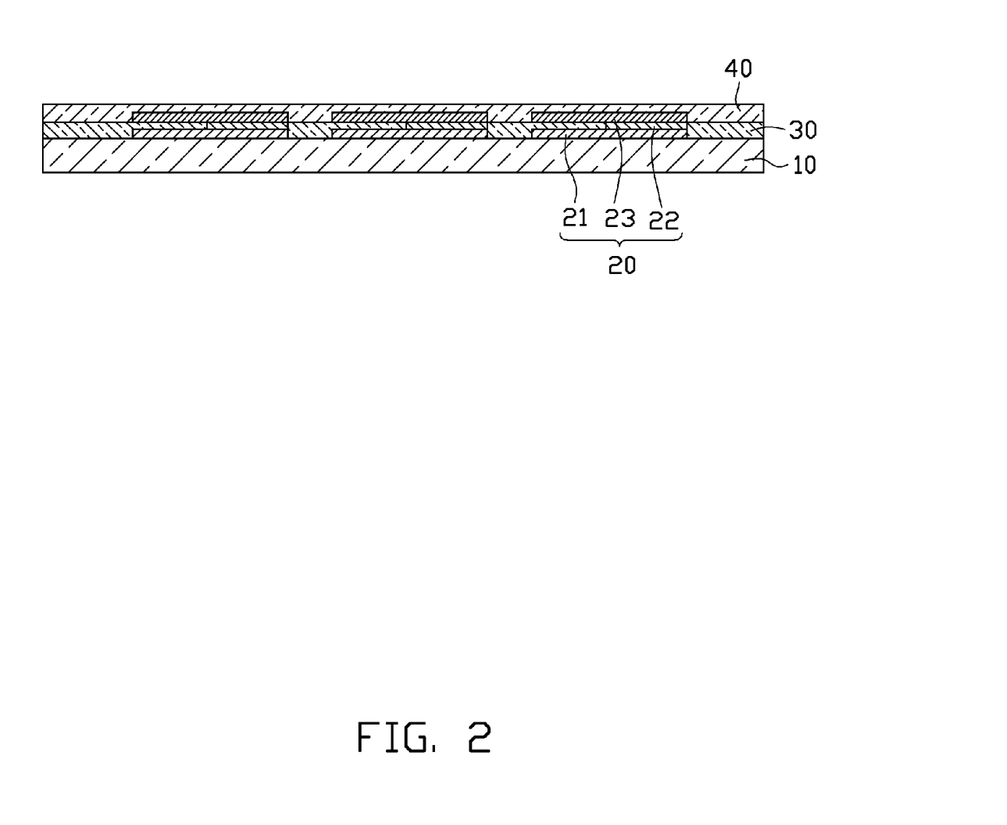
FIG. 2 is a cross sectional view of the backlight film, taken along line II-II of FIG. 1.

Referring to FIGS. 1 and 2, a backlight film 100 includes a flexible substrate 10, a plurality of polymer light emitting diodes (PLEDs) 20, an insulating layer 30 and a protection layer 40.

In the present embodiment, the substrate 10 is made of polyethylene terephthalate (PET). The substrate 10 can be transparent or opaque.

Each of the polymer light emitting diodes 20 includes a first electrode 21, a polymeric light emitting layer 22 and a second electrode 23. The first electrode 21, the polymeric light emitting layer 22 and the second electrode 23 are successively formed on the substrate 10.

In the present embodiment, the first electrode 21 is made of an electrical conductive polymer, poly(3,4-ethylenedioxythiophene):poly(styrenesulfonate) (PEDOT:PSS). The polymeric light emitting layer 22 is made of a mixture of blue phosphorescent polymer and red phosphorescent polymer. The second electrode 23 is made of polyurethane doped with silver nano-particles. In other embodiments, materials such as indium tin oxide (ITO) can be suitable for the first electrodes 21 and second electrodes 23.

The polymer light emitting diodes 20 are arranged in an array on the substrate 10. One end of each of the first electrodes 21 of the polymer light emitting diodes 20 is connected to a first electrode circuit 24 directly formed on the substrate 10. Also, one end of each of the second electrodes 23 of the polymer light emitting diodes 20 is connected to a second electrode circuit 25 directly formed on the insulating layer 30. When the first electrode circuit 24 and the second electrode circuit 25 are electrified, the first electrodes 21 and the second electrodes 23 activate the polymeric light emitting layer 22 together to emit light.

The insulating layer 30 is made of transparent epoxy, and is formed among the first electrodes 21 and the polymeric light emitting layers 22 of the polymer light emitting diodes 20. A thickness of the insulating layer 30 can be equal to or less than a sum of the thickness of the first electrodes 21 and the thickness of the polymeric light emitting layers 22. In the illustrated embodiment, the thickness of the insulating layer 30 is equal to the sum of the thickness of the first electrodes 21 and the thickness of the polymeric light emitting layers 22. The entire insulating layer 30 can be continuous.

The protection layer 40 covers the polymer light emitting diodes 20. The polymer light emitting diodes 20 are sandwiched between the protection layer 40 and the substrate 10. The protection layer 40 can also be made of transparent epoxy. In alternative embodiments, the protection layer 40 can be made of a different material from that of the insulating layer 30.

The backlight film 100 can be made with the following steps.

Figure 3:
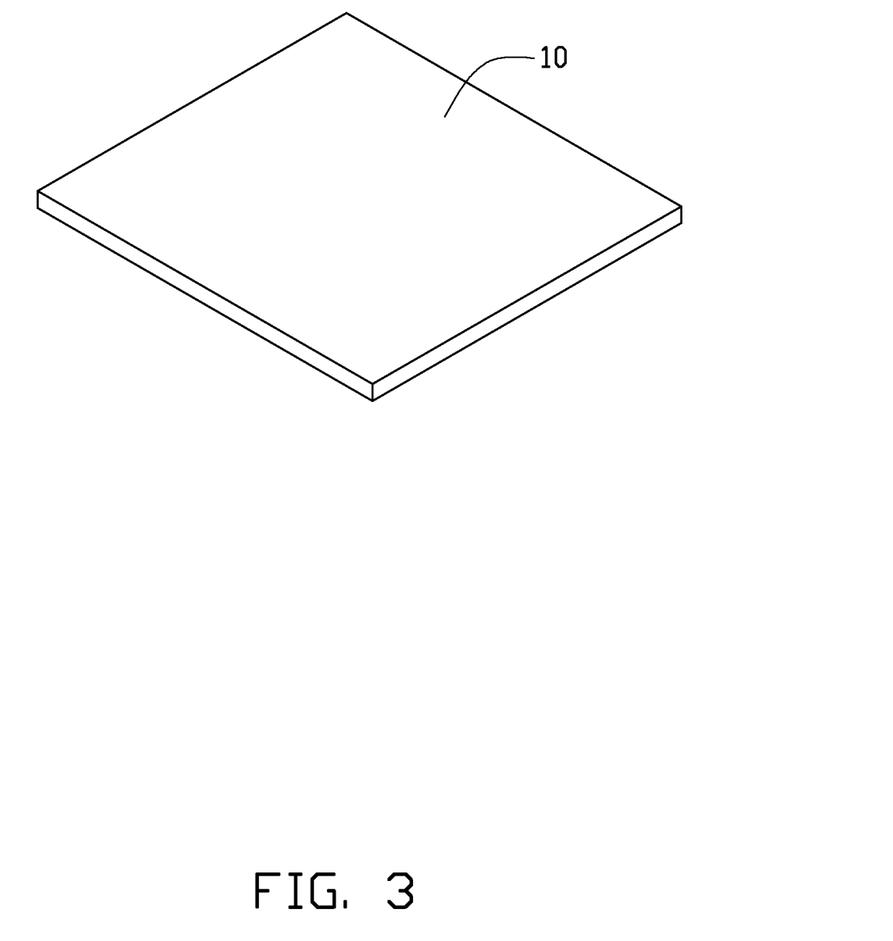
FIG. 3 shows a schematic view of an exemplary flexible substrate.

First, as shown in FIG. 3, one substrate 10 is provided. The substrate 10 is made of PET.

Figure 4:
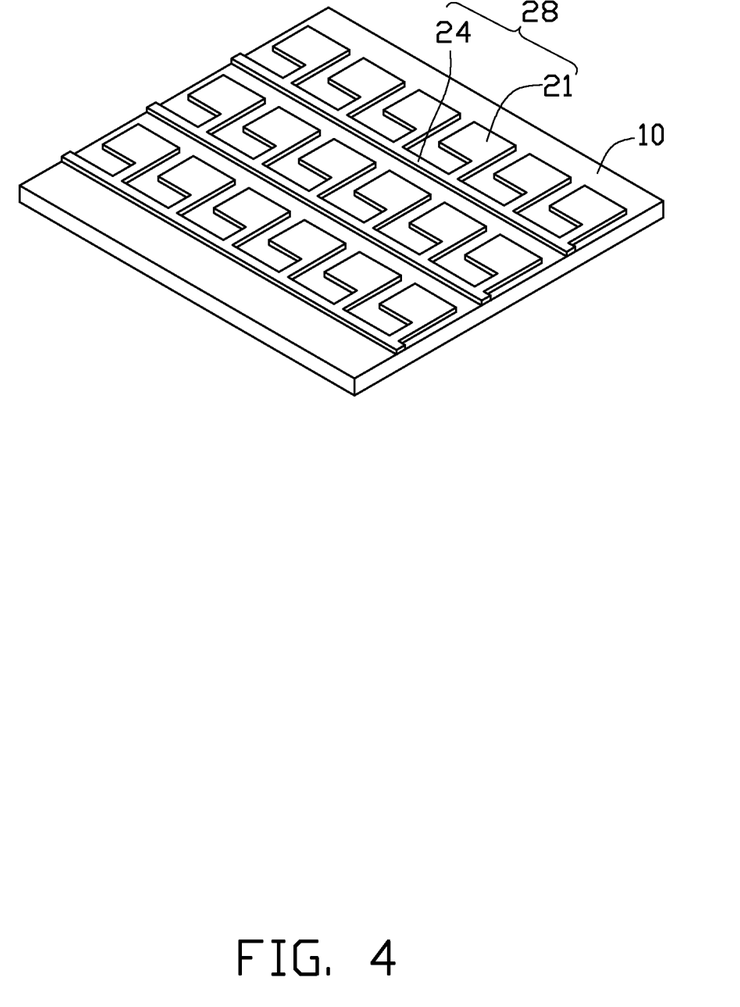
FIG. 4 shows a first electrode layer formed on the flexible substrate shown in FIG. 3.

Second, as shown in FIG. 4, a first electrode layer 28 is formed on the substrate 10. The first electrode layer 28 includes a number of spaced first electrodes 21 formed in an array of a predetermined pattern, and a number of first electrode circuits 24. In the illustrated embodiment, the array has three rows and six columns. The ends of the first electrodes 21 arranged in the same row are connected to a same one of the first electrode circuits 24, thus forming a comb-shaped configuration.

Figure 5:
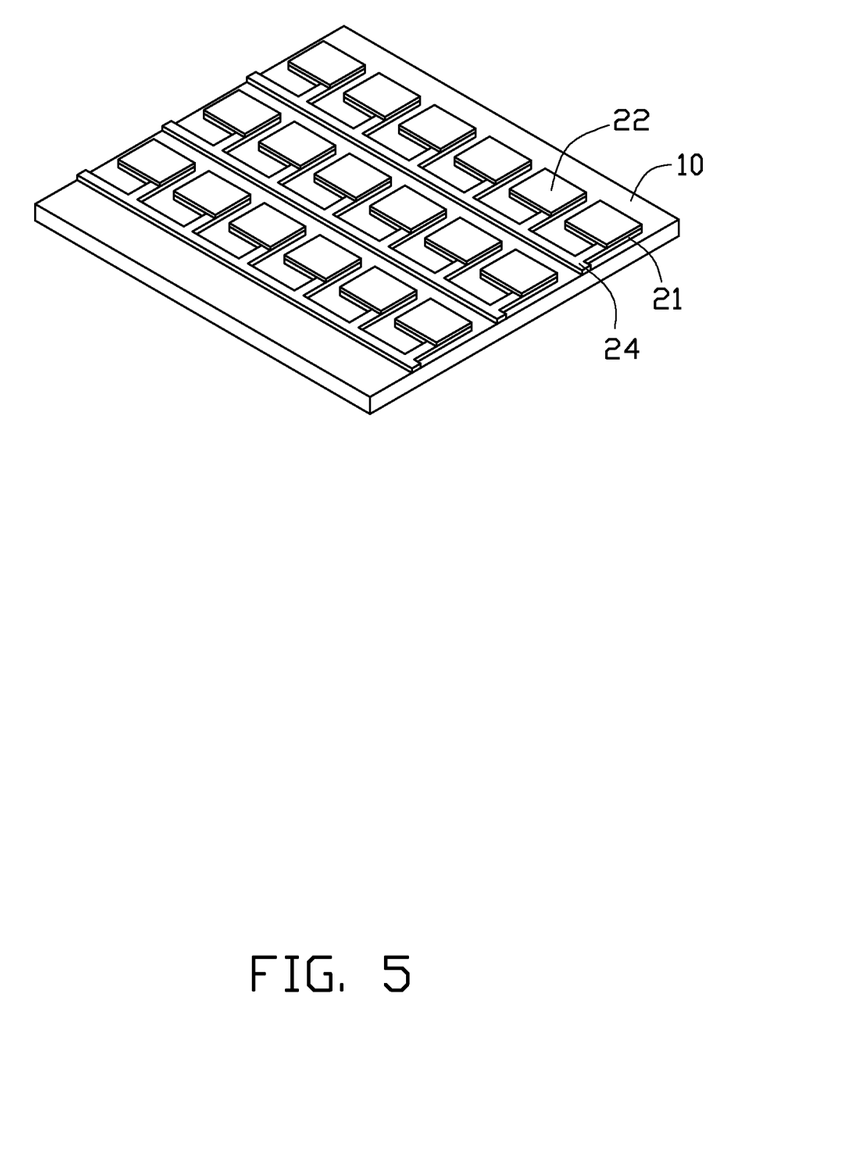
FIG. 5 shows a polymeric light emitting layer formed on the first electrode layer shown in FIG. 4.

Third, as shown in FIG. 5, the polymeric light emitting layers 22 are formed on the first electrodes 21. In addition, the polymeric light emitting layers 22 are square-shaped.

Figure 6:
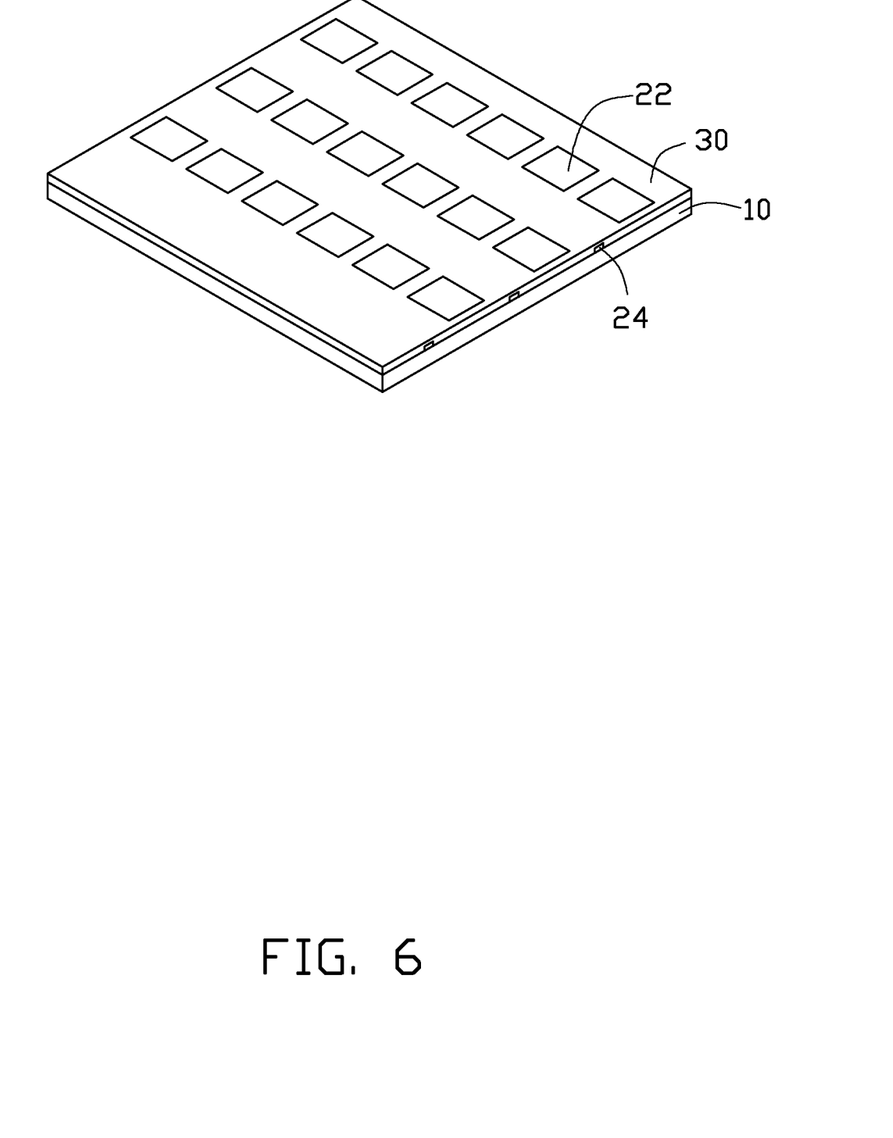
FIG. 6 shows an insulating layer in addition to the process shown in FIG. 5.

Fourth, as shown in FIG. 6, an insulating layer 30 is formed among the polymeric light emitting layers 22. A thickness of the insulating layer 30 is equal to or less than a sum of the thickness of the first electrode 21 and the thickness of the polymeric light emitting layer 22. In the illustrated embodiment, the thickness of the insulating layer 30 is equal to the sum of the thickness of the first electrode 21 and the thickness of the polymeric light emitting layer 22.

Figure 7:
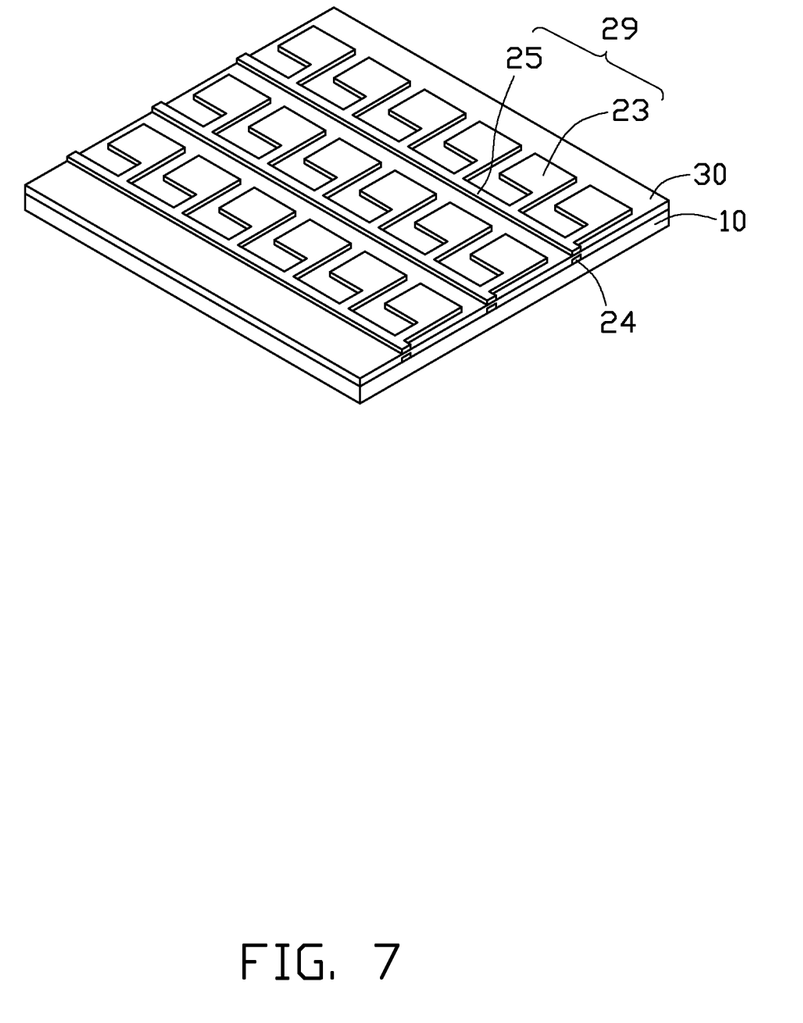
FIG. 7 shows a second electrode layer formed on top of the polymeric light emitting layer and on the insulating layer based on the arrangement shown in FIG. 6.

Fifth, as shown in FIG. 7, the second electrode layer 29 is then formed on the polymeric light emitting layers 22 and on the insulating layer 30. In the illustrated embodiment, the pattern of the second electrode layer 29 is the same as that of the first electrode layer 28. That is, the second electrode layer 29 also includes a number of spaced second electrodes 23 and a number of second electrode circuits 25. The ends of the second electrodes 23 arranged in the same row are connected to a same one of the second electrode circuits 25, thus forming a comb-shaped configuration.

Sixth, referring again to FIGS. 1 and 2, a protection layer 40 is formed on the second electrode layer 29 and the insulating layer 30.

Figure 8:
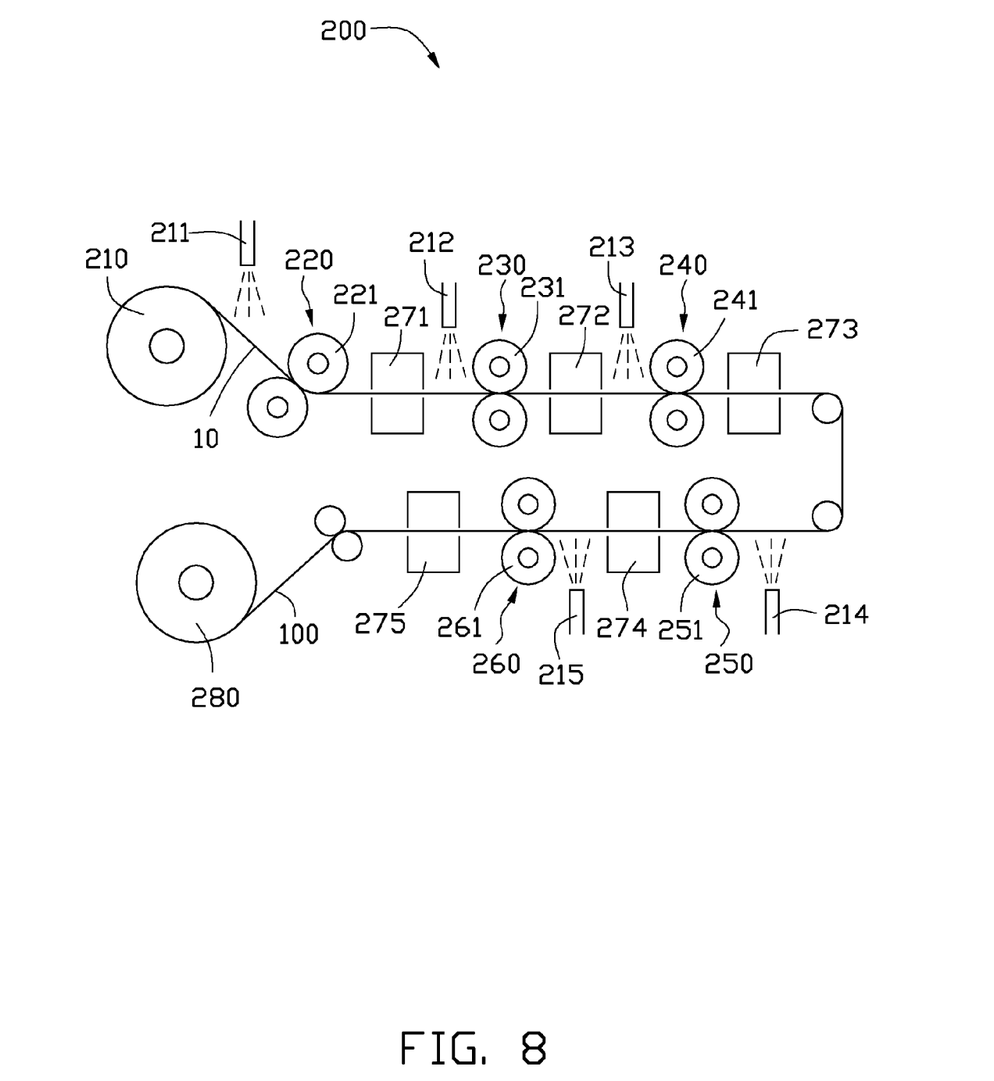
FIG. 8 is a schematic view of an apparatus for forming the backlight film of FIG. 1 in accordance with one embodiment.

Referring to FIG. 8, an apparatus 200 for forming the backlight film 100 is provided. The apparatus 200 includes a film releasing reel 210, a first electrode layer forming roller pair 220, a polymeric light emitting layer forming roller pair 230, an insulating layer forming roller pair 240, a second electrode layer forming roller pair 250, a protection layer forming roller pair 260, a first drying device to the fifth drying device 271, 272, 273, 274, 275, a first solvent feeder to a fifth solvent feeder 211, 212, 213, 214, 215, and a film take-up reel 280 arranged in an order in a line.

The first releasing reel 210 and the film take-up reel 280 are arranged at two ends of the apparatus 200. The first releasing reel 210 is used for paying out the substrate 10, and the film take-up reel 280 is used for taking up the formed backlight film 100. The first drying device to the fifth drying device 271, 272, 273, 274, 275 can be ovens. The first solvent feeder to the fifth solvent feeder 211, 212, 213, 214, 215 are configured to feed the first electrode layer forming solvent, the polymeric light emitting layer forming solvent, the insulating layer forming solvent, the second electrode layer forming solvent, and the protection layer forming solvent to substrate 10 in sequence. The solvents are in a liquid state which has slow fluidity and can be printed patterns by rollers.

The first solvent feeder 211 is arranged between the first releasing reel 210 and the first electrode layer forming roller pair 220, and configured to feed the first electrode layer forming solvent to the substrate 10.

The first electrode layer forming roller pair 220 includes a first electrode layer forming roller 221 arranged on top of the substrate 10 and a support roller arranged underneath the substrate 10. The first electrode layer forming roller 221 is a copper-coated roller. A predetermined concave pattern is formed in a surface of the first electrode layer forming roller 221. The first electrode layer forming roller 221 prints the first electrode layer forming solvent to be a first electrode solvent layer.

The first drying device 271 is arranged after the first electrode layer forming roller pair 220, and is configured to dry the first electrode solvent layer to form the first electrode layer 28 (shown in FIG. 4).

The second solvent feeder 212 is arranged between the first drying device 271 and the polymeric light emitting layer forming roller pair 230, and is configured to feed the polymeric light emitting layer forming solvent to areas of the substrate 10 where the first electrodes 21 (shown in FIG. 4) are formed.

The polymeric light emitting layer forming roller pair 230 includes a polymeric light emitting layer forming roller 231 arranged on top of the substrate 10 and a support roller arranged under the substrate 10. The polymeric light emitting layer forming roller 231 is also a copper-coated roller. A predetermined concave pattern is formed in a surface of the polymeric light emitting layer forming roller 231. The polymeric light emitting layer forming roller 231 prints the polymeric light emitting layer forming solvent to be a polymeric light emitting solvent layer.

The second drying device 272 is arranged after the polymeric light emitting layer forming roller pair 230, and is configured to dry the polymeric light emitting solvent layer to be the polymeric light emitting layer 22 (shown in FIG. 5).

The third solvent feeder 213 is arranged between the second drying device 272 and the insulating layer forming roller pair 240, and is configured to feed the insulating layer forming solvent to areas of the substrate 10 around the polymeric light emitting layers 22 (shown in FIGS. 5-6).

The insulating layer forming roller pair 240 includes an insulating forming roller 241 arranged on top of the substrate 10 and a support roller arranged underneath the substrate 10. The insulating forming roller 241 is also a copper-coated roller. A predetermined concave pattern is formed in a surface of the insulating forming roller 241 which is opposite to the pattern of the polymeric light emitting layer 22. The insulating forming roller 241 prints the insulating layer forming solvent to form an insulating solvent layer around the first electrodes 21 and the polymeric light emitting layer 22.

The third drying device 273 is arranged after the insulating layer forming roller pair 240, and is configured to dry the insulating solvent layer to be the insulating layer 30 (shown in FIG. 6).

The fourth solvent feeder 214 is arranged between the third drying device 273 and the second electrode layer forming roller pair 250, and is configured to feed the second electrode layer forming solvent to areas of the substrate 10 where the polymeric light emitting layers 22 are formed.

The second electrode layer forming roller pair 250 includes a second electrode layer forming roller 251 arranged under the substrate 10 and a support roller arranged on top of the substrate 10. The second electrode layer forming roller 251 is also a copper-coated roller. A predetermined concave pattern is formed in a surface of the second electrode layer forming roller 251 which can be the same as the pattern of the first electrodes 21 (shown in FIG. 4). The second electrode layer forming roller 251 prints the second electrode layer forming solvent to be a second electrode solvent layer.

The fourth drying device 274 is arranged after the second electrode layer forming roller pair 250, and is configured to dry the second electrode solvent layer to form the second electrode layer 29 (shown in FIG. 7).

The fifth solvent feeder 215 is arranged between the fourth drying device 274 and the protection layer forming roller pair 260, and is configured to feed the protection layer forming solvent to the substrate 10.

The protection layer forming roller pair 260 includes a protection layer forming roller 261 arranged under the substrate 10 and a support roller arranged on top of the substrate 10. The protection layer forming roller pair 260 is configured to form a protection solvent layer over the entire substrate 10 on the second electrodes 23 (shown in FIG. 2) and the insulating layer 30 (shown in FIG. 2).

The fifth drying device 275 is arranged between the protection layer forming roller pair 260 and the film take-up reel 280, and is configured to dry the protection solvent layer to form the protection layer 40 (shown in FIGS. 1-2).

The integration of the polymer light emitting diodes 20 on a substrate forms a backlight film which can be produced as large as desired, thereby facilitating reducing volume of backlight module where the backlight film is used. The backlight film has the light source and the light guide plate functions.

It is understood that the above-described embodiments are intended to illustrate rather than limit the disclosure. Variations may be made to the embodiments and methods without departing from the spirit of the disclosure. Accordingly, it is appropriate that the appended claims be construed broadly and in a manner consistent with the scope of the disclosure.

What is claimed is:
1. A backlight film, comprising:
   a flexible substrate;
   a plurality of polymer light emitting diodes each including
      a first electrode formed on the flexible substrate, a polymeric light emitting layer formed on the first electrode and a second electrode formed on the polymeric light emitting layer, the polymer light emitting diodes arranged in an array;

a first electrode circuit formed on the flexible substrate, one end of each of the first electrodes connected to the first electrode circuit, and the first electrodes being powered by the first electrode circuit, the first electrode circuit and the first electrodes cooperatively forming a comb-shaped first electrode layer;

an insulating layer formed among the first electrodes and the polymeric light emitting layers of the polymer light emitting diodes, a thickness of the insulating layer being equal to or less than a sum of that of the first electrode and that of the polymeric light emitting layer;

a second electrode circuit formed on the insulating layer, one end of each of the second electrodes connected to the second electrode circuit, and the second electrodes being powered by the second electrode circuit, the second electrode circuit and the second electrodes cooperatively forming a comb-shaped second electrode layer, the first electrodes and the second electrodes configured for cooperatively activating the polymeric light emitting layer; and a protection layer covering the flexible substrate, the protection layer and the flexible substrate sandwiching the polymer light emitting diodes, the first electrode circuit, the insulating layer, and the second electrode circuit therebetween.

2. The backlight film of claim 1, wherein the insulating layer and the protection layer are made of a same transparent material.

3. The backlight film of claim 2, wherein the transparent material is epoxy.

4. The backlight film of claim 1, wherein the flexible substrate is made of polyethylene terephthalate, the first electrodes are made of poly(3,4-ethylenedioxythiophene):poly(styrenesulfonate), the polymeric light emitting layer is made of a mixture of blue phosphorescent polymer and red phosphorescent polymer, and the second electrodes are made of nano-sized polyurethane particles doped with silver.

5. A backlight film, comprising:
a flexible substrate, the flexible substrate made of polyethylene terephthalate;
a plurality of polymer light emitting diodes each including a first electrode formed on the flexible substrate, a polymeric light emitting layer formed on the first electrode and a second electrode formed on the polymeric light emitting layer, the polymer light emitting diodes arranged in an array, the first electrodes made of poly(3,4-ethylenedioxythiophene):poly(styrenesulfonate), the polymeric light emitting layer made of a mixture of blue phosphorescent polymer and red phosphorescent polymer, and the second electrodes made of nano-sized polyurethane particles doped with silver;
a first electrode circuit formed on the flexible substrate, one end of each of the first electrodes connected to the first electrode circuit, and the first electrodes being powered by the first electrode circuit;
an insulating layer formed among the first electrodes and the polymeric light emitting layers of the polymer light emitting diodes, a thickness of the insulating layer being equal to or less than a sum of that of the first electrode and that of the polymeric light emitting layer;
a second electrode circuit formed on the insulating layer, one end of each of the second electrodes connected to the second electrode circuit, and the second electrodes being powered by the second electrode circuit, the first electrodes and the second electrodes configured for cooperatively activating the polymeric light emitting layer; and
a protection layer covering the flexible substrate, the protection layer and the flexible substrate sandwiching the polymer light emitting diodes, the first electrode circuit, the insulating layer, and the second electrode circuit therebetween.

6. The backlight film of claim 5, wherein the insulating layer and the protection layer are made of a same transparent material.

7. The backlight film of claim 6, wherein the transparent material is epoxy.

8. A backlight film, comprising:
a flexible substrate;
a plurality of polymer light emitting diodes each including a first electrode formed on the flexible substrate, a polymeric light emitting layer formed on the first electrode and a second electrode formed on the polymeric light emitting layer, the polymer light emitting diodes arranged in an array having a plurality of rows and a plurality of columns;
a plurality of first electrode circuits formed on the flexible substrate, the first electrodes in a same row corresponding to one of the first electrode circuits, one end of each of the first electrodes in the same row connected to the corresponding first electrode circuit, and the first electrodes in the same row powered by the corresponding first electrode circuit, the corresponding first electrode circuit and the first electrodes in the same row cooperatively forming a comb-shaped configuration;
an insulating layer formed among the first electrodes and the polymeric light emitting layers of the polymer light emitting diodes, a thickness of the insulating layer being equal to or less than a sum of that of the first electrode and that of the polymeric light emitting layer;
a plurality of second electrode circuits formed on the insulating layer, the second electrodes in a same row corresponding to one of the second electrode circuits, one end of each of the second electrodes in the same row connected to the corresponding second electrode circuit, and the second electrodes in the same row powered by the corresponding second electrode circuit, the corresponding second electrode circuit and the second electrodes in the same row cooperatively forming a comb-shaped configuration, the first electrodes and the second electrodes configured for cooperatively activating the polymeric light emitting layer; and
a protection layer covering the flexible substrate, the protection layer and the flexible substrate sandwiching the polymer light emitting diodes, the first electrode circuits, the insulating layer, and the second electrode circuits therebetween.

9. The backlight film of claim 8, wherein the flexible substrate is made of polyethylene terephthalate, the first electrodes are made of poly(3,4-ethylenedioxythiophene):poly(styrenesulfonate), the polymeric light emitting layer is made of a mixture of blue phosphorescent polymer and red phosphorescent polymer, and the second electrodes are made of nano-sized polyurethane particles doped with silver.

10. The backlight film of claim 9, wherein the insulating layer and the protection layer are made of a same transparent material.

11. The backlight film of claim 10, wherein the transparent material is epoxy.

* * * * *